(12) United States Patent
Eguchi et al.

(10) Patent No.: US 6,844,234 B2
(45) Date of Patent: Jan. 18, 2005

(54) SEMICONDUCTOR DEVICE AND METHOD FOR MANUFACTURING SEMICONDUCTOR DEVICE

(75) Inventors: Kazuhiro Eguchi, Chigasaki (JP); Seiji Inumiya, Yokohama (JP); Yoshitaka Tsunashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 69 days.

(21) Appl. No.: 10/101,913

(22) Filed: Mar. 21, 2002

(65) Prior Publication Data

US 2003/0127640 A1 Jul. 10, 2003

(30) Foreign Application Priority Data

Jan. 8, 2002 (JP) ........................................ 2002-001546

(51) Int. Cl.[7] ........................................... H01L 21/3205
(52) U.S. Cl. .................... 438/287; 438/591; 438/780; 438/783; 438/786; 438/787; 438/790
(58) Field of Search ............................ 438/82, 99, 562, 438/780, 787, 790, FOR 135, FOR 168, FOR 323, FOR 424, 287, 591, 783, 786

(56) References Cited

U.S. PATENT DOCUMENTS

| | | | | |
|---|---|---|---|---|
| 3,796,182 A | * | 3/1974 | Rosler, Richard S. ...... | 118/725 |
| 5,000,113 A | * | 3/1991 | Wang et al. .............. | 118/723 E |
| 5,364,664 A | * | 11/1994 | Tsubouchi et al. .......... | 427/535 |
| 6,040,022 A | * | 3/2000 | Chang et al. ................ | 427/579 |
| 6,159,854 A | * | 12/2000 | Ohtsuka et al. ............. | 438/681 |
| 6,444,137 B1 | * | 9/2002 | Collins et al. ................ | 216/79 |
| 6,451,686 B1 | * | 9/2002 | Ngai et al. .................. | 438/623 |
| 6,482,752 B1 | * | 11/2002 | Yamazaki et al. .......... | 438/758 |
| 6,486,080 B2 | * | 11/2002 | Chooi et al. ................ | 438/785 |
| 2001/0023120 A1 | * | 9/2001 | Tsunashima et al. ........ | 438/585 |
| 2002/0064970 A1 | * | 5/2002 | Chooi et al. ................ | 438/785 |

FOREIGN PATENT DOCUMENTS

| | | |
|---|---|---|
| JP | 5-226608 | 9/1993 |
| JP | 5-239650 | 9/1993 |
| JP | 6-160657 | 6/1994 |
| JP | 11-111715 | 4/1999 |
| JP | 2000-49349 | 2/2000 |
| JP | 2001-257344 | 9/2001 |

* cited by examiner

*Primary Examiner*—George Fourson
*Assistant Examiner*—Joannie Adelle Garcia
(74) *Attorney, Agent, or Firm*—Finnegan, Henderson, Farabow, Garrett & Dunner, L.L.P.

(57) ABSTRACT

A semiconductor device comprising a semiconductor substrate, a gate dielectrics formed on the semiconductor substrate and including a silicon oxide film containing a metallic element, the silicon oxide film containing the metallic element including a first region near a lower surface thereof, a second region near an upper surface thereof, and a third region between the first and second regions, the metallic element contained in the silicon oxide film having a density distribution in a thickness direction of the silicon oxide film, a peak of the density distribution existing in the third region, and an electrode formed on the gate dielectrics.

10 Claims, 5 Drawing Sheets

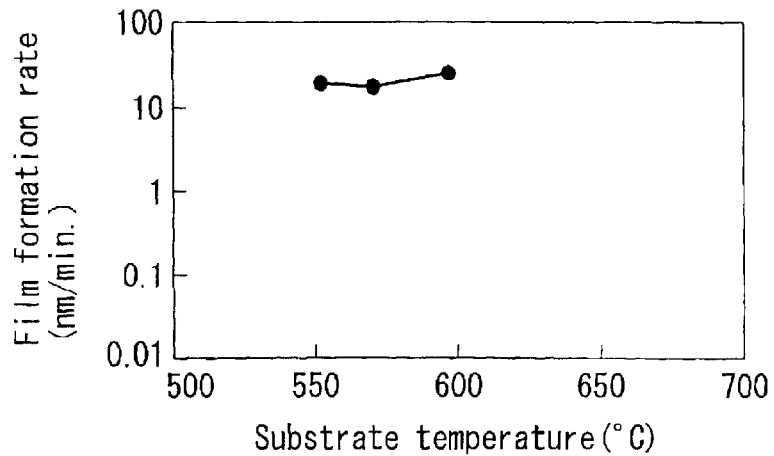
FIG. 5
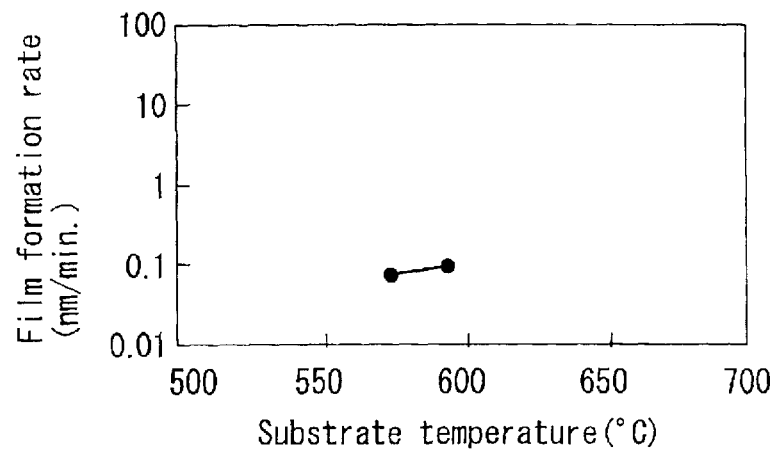
FIG. 6
| HTB flow rate (sccm) | TEOS flow rate (sccm) | Film thickness (nm) | Hf/(Hf+Si) (%) |
|---|---|---|---|
| 0.31 | 11.9 | 40.3 | 23 |
| 0.16 | 11.9 | 25.7 | 19 |
| 0.03 | 11.9 | 7.9 | 12 |
| 0.03 | 23.8 | 10.1 | 10 |
| 0.02 | 11.9 | 4.4 | 7 |
| 0 | 11.9 | 0 | - |
| 0.31 | 0 | <1.0 | - |
FIG. 7

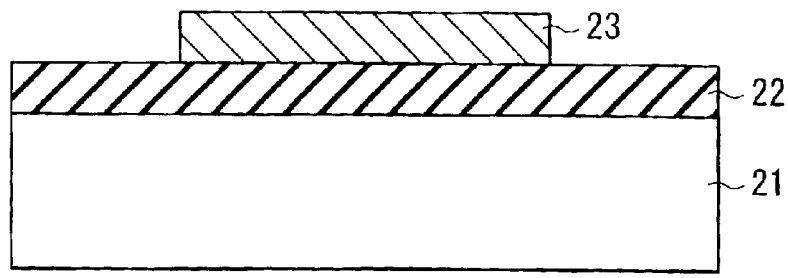
FIG. 8
| Insulation film forming process | Interface level density ($cm^{-2}eV^{-1}$) |
|---|---|
| TEOS-HTB-$O_2$ | $2 \times 10^{11}$ |
| Plasma TEOS-$O_2$ | $1 \times 10^{13}$ |
| TEOS-$O_3$ | $5 \times 10^{12}$ |
FIG. 9
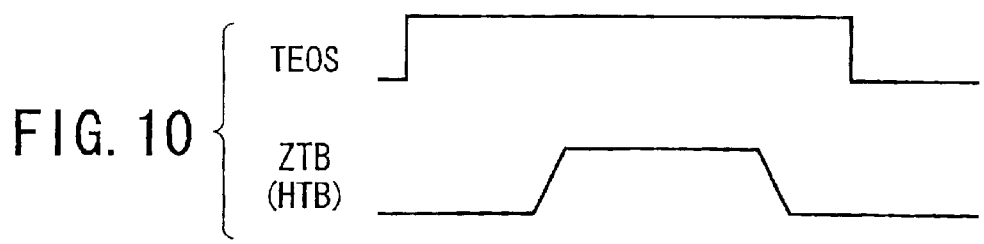
FIG. 10

SEMICONDUCTOR DEVICE AND METHOD FOR MANUFACTURING SEMICONDUCTOR DEVICE

CROSS-REFERENCE TO RELATED APPLICATIONS

This application is based upon and claims the benefit of priority from the prior Japanese Patent Application No. 2002-001546, filed Jan. 8, 2002, the entire contents of which are incorporated by reference.

BACKGROUND OF THE INVENTION

1. Field of the Invention

The present invention relates to a semiconductor device and method for manufacturing the semiconductor device, and more particularly to an insulating film used in the semiconductor device.

2. Description of the Related Art

In accordance with the development of MOSFET microfabrication, there is a demand for thinning a gate dielectrics (gate insulating film). A conventional silicon oxide film or silicon oxynitride film cannot have a thickness less than about 2 nm because of an increased direct tunnel current.

In light of this, it has been proposed to use, as a gate dielectrics, a silicon oxide film containing a metal (i.e., a metal silicate film, also called a "silicate film"). Since the metal silicate film has a higher dielectric constant than a silicon oxide film, and a relatively high crystallization temperature, it is suitable for a polysilicon (or poly-SiGe) gate electrode forming process.

Further, to suppress diffusion of boron from a gate electrode, the use of an oxynitride metal silicon film has been proposed (see Jpn. Pat. Appln. KOKAI Publication No. 2000-49349). However, an oxynitride metal silicon film having good interface characteristics has not yet been developed. Moreover, since a metal nitride has a conductive property, a large amount of leakage current flows in the film. Further, the film has a high trap density. In addition, a metal silicide may be formed at a gate electrode interface, thereby degrading the insulation property of the film.

A CVD (Chemical Vapor Deposition) method using an organic silane is given as an example of a metal silicate-forming method. Among organic silanes, tetraethoxysilane ($Si(OC_2H_5)_4$: TEOS) is often used. Since TEOS has a high decomposition temperature, a temperature not less than 700° C. is necessary if a thermal CVD method is used. To execute a film-forming process at a lower temperature, ozone ($O_3$) may be used together with TEOS, or a plasma CVD method may be used.

When using ozone or plasma, however, active oxygen species such as oxygen radicals or oxygen ions will be inevitably created in the film-forming atmosphere. Active oxidation species have a high reactivity and hence oxidize the underlayer of the device. Further, in the case of using plasma, the underlayer may be damaged by plasma.

The following publications disclose various methods for forming a metal silicate film.

Jpn. Pat. Appln. KOKAI Publication No. 5-239650 discloses a process for adding alkoxide of a titanium group element or an alkylamine compound in a CVD process using alkoxy silane as a source. This process uses ozone or plasma, and is therefore considered a process that uses active oxygen species.

Jpn. Pat. Appln. KOKAI Publication No. 6-160657 also discloses a process using ozone, i.e., an active oxygen species.

Jpn. Pat. Appln. KOKAI Publication No. 11-111715 discloses a process for adding, to a source gas, a product resulting from thermal decomposition of a compound containing alkoxide. However, there is no description concerning mixing of a silicon source and a metal source.

Jpn. Pat. Appln. KOKAI Publication No. 5-226608 discloses the use of titanium as a metal contained in a metal silicate film. It is difficult, however, to produce satisfactory characteristics from a metal silicate film containing titanium, and hence to use the film in a semiconductor device.

As described above, in the prior art, it is difficult to obtain a metal silicate film having excellent characteristics, and/or the underlayer may be adversely affected by forming the film. This means that it is difficult to obtain a semiconductor device having excellent characteristics and high reliability.

BRIEF SUMMARY OF THE INVENTION

According to a first aspect of the invention, there is provided a semiconductor device comprising: a semiconductor substrate; a gate dielectrics formed on the semiconductor substrate and including a silicon oxide film containing a metallic element, the silicon oxide film containing the metallic element including a first region near a lower surface thereof, a second region near an upper surface thereof, and a third region between the first and second regions, the metallic element contained in the silicon oxide film having a density distribution in a thickness direction of the silicon oxide film, a peak of the density distribution existing in the third region; and an electrode formed on the gate dielectrics.

According to a second aspect of the invention, there is provided a method of manufacturing a semiconductor device, comprising: forming an amorphous silicon film on a semiconductor substrate, the amorphous silicon film containing a metallic element and having a first region near a lower surface thereof, a second region near an upper surface thereof, and a third region between the first and second regions, the metallic element contained in the amorphous silicon film having a density distribution in a thickness direction of the amorphous silicon film, a peak of the density distribution existing in the first or third region; and oxidizing the amorphous silicon film containing the metallic element to form a silicon oxide film containing the metallic element.

According to a third aspect of the invention, there is provided a method of manufacturing a semiconductor device, comprising: supplying, into a chamber in which a substrate is held, an organic compound containing silicon and an organic compound containing a metallic element selected from a group consisting of Zr, Hf, Al and La; and forming a silicon oxide film containing the metallic element on the substrate by a thermal CVD method that does not use an active oxygen species.

According to a fourth aspect of the invention, there is provided a method of manufacturing a semiconductor device, including forming a silicon oxide film containing a metallic element on a semiconductor substrate by a CVD method, comprising: starting supply of an organic compound containing silicon into a chamber in which a semiconductor substrate is held; starting supply of an organic compound containing a metallic element into the chamber, after the starting supply of the organic compound containing silicon; and increasing a supply amount of the organic compound containing the metallic element.

BRIEF DESCRIPTION OF THE SEVERAL VIEWS OF THE DRAWING

FIG. 5 is a graph illustrating the relationship between deposition rate of the metal silicate and substrate temperature in the second embodiment;

FIG. 6 is a graph illustrating the relationship between deposition rate of the metal silicate and substrate temperature in an example to be compared with the second embodiment;

FIG. 7 is a view illustrating the measurement results of metal silicate films obtained when the flow rates of HTB and TEOS are varied in the second embodiment;

FIG. 8 is a cross-sectional view illustrating a semiconductor device according to the second embodiment;

FIG. 9 is a table explaining the reduction effect of the interface state density in the second embodiment; and FIG. 10 is a view illustrating a gas supply sequence according to a third embodiment of the invention.

DETAILED DESCRIPTION OF THE INVENTION

Embodiments of the invention will be described with reference to the accompanying drawings.

(First Embodiment)

Referring to some of the drawings, a description will be given of a first embodiment of the invention.

Figure 1:
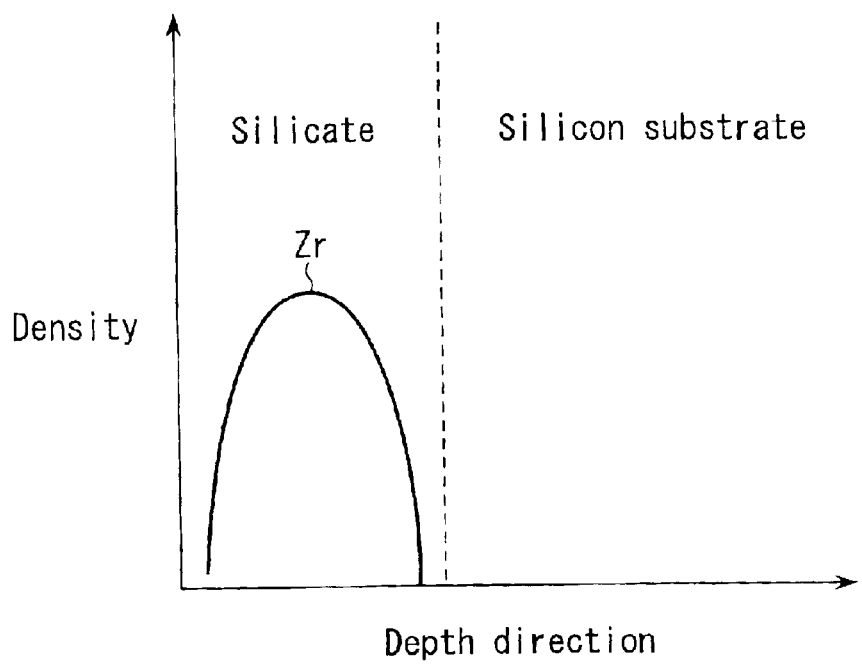
FIG. 1 is a schematic view illustrating the film-thickness-directional density distribution of a metallic element contained in a metal silicate film according to a first embodiment of the invention.

FIG. 1 is a view schematically illustrating the film-thickness-directional density distribution of a metallic element contained in a metal silicate film (a silicon oxide film containing a metal) used as a gate dielectrics (gate insulating film) and employed in a MIS (MOS) FET according to the first embodiment of the invention. Although this embodiment uses Zr (zirconium) as the metallic element, the same effect can be obtained even if another element, such as Hf (hafnium), Al (aluminum) or La (lanthanum), etc., is used, which increases, when added into the silicon oxide film, the dielectric constant of the film to a value higher than that of the original silicon oxide film.

As shown in FIG. 1, the density of Zr is maximum at a substantially central portion of the metal silicate film. It is not always necessary to set the density peak at the center of the metal silicate film. It is sufficient if the density peak exists anywhere within the area of the film sandwiched between the area near the lower surface (an area near the interface of the metal silicate film and silicon substrate) and the area near the upper surface (an area near the interface of the metal silicate film and gate electrode).

This structure can provide an MIS FET of excellent characteristics and reliability. In other words, the fixed charge density at the interface of the semiconductor substrate is low, which suppresses degradation in the channel mobility. Further, if the gate electrode is made of polysilicon or poly-SiGe, silicide reaction can be suppressed at the interface of the gate electrode, to thereby prevent a reduction in the reliability of the FET.

Figure 2:
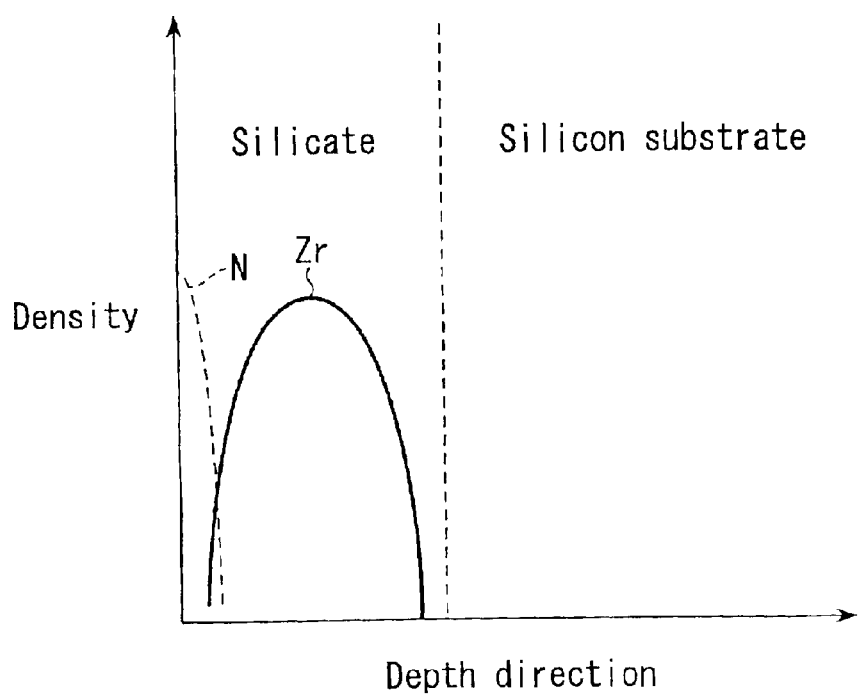
FIG. 2 is a schematic view illustrating the film-thickness-directional density distribution of a metallic element and nitrogen contained in the metal silicate film according to the first embodiment.

FIG. 2 is a schematic view illustrating the density distribution of Zr and N (nitrogen) obtained when nitrogen (N) has been introduced into the gate electrode side of the silicate film in the above structure. As shown in FIG. 2, the density of N in the silicate film is maximum near the interface of the film and gate electrode.

If polysilicon or poly-SiGe is used as the material of the gate electrode, since the density distribution of N in the metal silicate film sharply peaks near the upper surface, as described above, diffusion of an impurity such as boron, used as a dopant, into the gate dielectrics and then into the semiconductor substrate can be effectively suppressed. Moreover, the reaction between Zr and N can be suppressed, thereby suppressing both an increase in leakage current and a reduction in reliability. In addition, the nitrogen existing within the film near its upper surface, suppresses an increase in the fixed charge density near the interface of the substrate, which suppresses degradation in the channel mobility.

In this embodiment, only one metallic element is contained in the metal silicate film. However, two or more elements, selected from Zr, Hf, Al and La, may be used.

Referring then to FIGS. 3A–3E, a process for manufacturing the semiconductor device will be described.

Figure 3A:
FIGS. 3A–3E are cross-sectional views illustrating a manufacturing method of a semiconductor device according to the first embodiment.

Firstly, as shown in FIG. 3A, a silicon substrate 11 with a standard isolation area (not shown) is prepared.

Figure 3B:
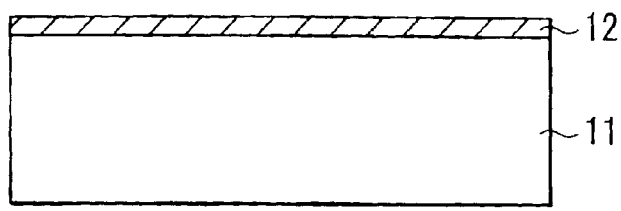

Subsequently, as shown in FIG. 3B, an amorphous silicon film 12 containing Zr with a thickness of about 2 nm is deposited on the silicon substrate 11 by the LPCVD method using, for example, $ZrCl_4$, $SiH_4$, and $H_2$. The typical film-deposition conditions are 500° C. and 0.5 Torr. The peak of the Zr density of the amorphous silicon film 12 can be controlled by the flow rates of $ZrCl_4$ and $SiH_4$, such that it appears in a substantially central portion of the film.

The amorphous silicon film 12 may be deposited by sputtering using a Zr target and Si target. In this case, the peak of the Zr density can be adjusted such that it appears in a substantially central portion of the film, by controlling the power ratio between Zr sputtering and Si sputtering.

It is not always necessary to set the peak of the Zr density at the center of the amorphous silicon film 12. It is sufficient if the peak exists anywhere in the region sandwiched by areas of the film 12 near its lower and upper surfaces. Alternatively, the peak may exist within the film 12 near the lower surface of the film 12.

Figure 3C:
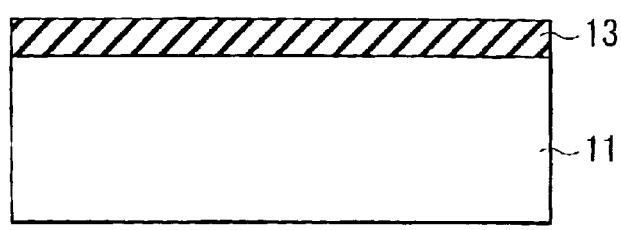

Thereafter, as shown in FIG. 3C, the amorphous silicon film 12 containing Zr is oxidized by $O_2$ plasma oxidation, with the substrate temperature set to 400° C., thereby forming a Zr silicate film (a silicon oxide film containing Zr) 13. The Zr silicate film 13 has a Zr density distribution, as shown in FIG. 1, which reflects the Zr density distribution of the amorphous silicon film 12. The plasma oxidation method capable of oxidation at a relatively low temperature suppresses the crystallization during oxidation, thereby preventing morphological roughness of the film due to crystallization.

Even if the Zr density peak exists within the amorphous silicon film 12, it exists within the Zr silicate film 13 since a surface area of the silicon substrate 11 is also oxidized in the oxidation process.

Figure 3D:
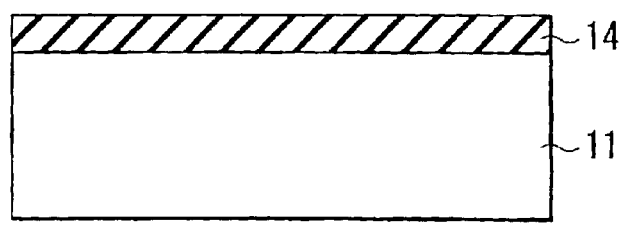

Referring now to FIG. 3D, the surface of the Zr silicate film 13 is nitrided by $N_2$ plasma, with the wafer temperature set to 400° C., thereby forming a Zr silicate film 14 having its surface nitrided. The Zr silicate film 14 has a nitrogen density distribution as shown in FIG. 2.

Figure 3E:
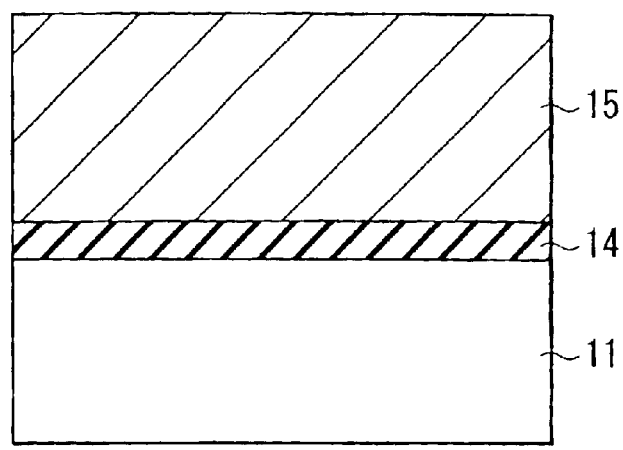

Referring then to FIG. 3E, a poly-SiGe film (or a polysilicon film) 15 as a gate electrode is deposited by LPCVD to a thickness of about 150 nm. Before depositing the poly-SiGe film 15, annealing may be executed, for example, at 900° C. for ten seconds to stabilize the introduced nitrogen.

After that, lithography, gate electrode etching, ion implantation and activating anneal, etc. are executed to form an MIS FET (not shown). Finally, a wiring process is executed to finish production of the semiconductor device (not shown).

As described above, in the embodiment, the density distribution of the metallic element contained in the metal silicate film is optimized, with the result that good interface characteristics can be obtained and a reaction at the gate electrode interface can be suppressed. Further, in the embodiment, the density distribution of nitrogen is optimized, thereby suppressing an increase in the trap density of the metal silicate film and also suppressing the diffusion of an impurity from the gate electrode. As a result, the embodiment can provide a highly reliable and high-performance semiconductor device.

Further, the embodiment uses Zr, Hf, Al or La as the metallic element, which increases the effective dielectric constant of the metal silicate film. Accordingly, a thick metal silicate film can be used as the gate dielectrics, which enables a highly reliable and high-performance semiconductor device to be realized.

Furthermore, in the embodiment, an amorphous silicon film is formed by using two element sources, i.e., a metal source and a silicon source, which facilitates the control of the composition of the film, and hence enables a high-performance low-cost semiconductor device to be produced. Also, in the embodiment, local formation of metal oxide crystals is suppressed, which can realize production of semiconductor devices within strict tolerances. The supply of nitrogen independent of the metallic element enables an optimal film composition to be easily realized.

In the embodiment, the amorphous silicon film is formed by CVD using a metal source and silicon source, which enables the film to be uniformly provided even on an irregular semiconductor surface, resulting in a highly reliable semiconductor device. The use of metal halide and silicon hydride as the metal source and silicon source, respectively, enables a film to be formed at a relatively low temperature, at which controllability of an extremely thin film can be secured. As a result, the product yield can be enhanced.

In addition, in the embodiment, the amorphous silicon film is oxidized by a method using an active oxidation species, for example, the $O_2$ plasma oxidation method, which enables the polycristallization of the metal silicate film to be suppressed. Yet further, the nitridation of the surface of the metal silicate film using plasma enables nitrogen to be introduced into the metal silicate film at a low temperature so that the sharp density distribution profile of nitrogen can be obtained.

(Second Embodiment)

A second embodiment of the invention will now be described with reference to the drawings related thereto. In this embodiment, a metal silicate film (a silicon oxide film containing a metallic element) is formed by thermal CVD without using an active oxygen species. An organic compound containing silicon and an organic compound containing a metallic element (Zr, Hf, Al or La) are used as gas sources.

(Embodiment 2-A)

In this embodiment, a metal silicate film is deposited by thermal CVD, using tetraethoxysilane ($Si(OC_2H_5)_4$: TEOS) and zirconium-tertiarybuthoxide ($Zr(Ot-C_4H_9)_4$: ZTB).

Figure 4:
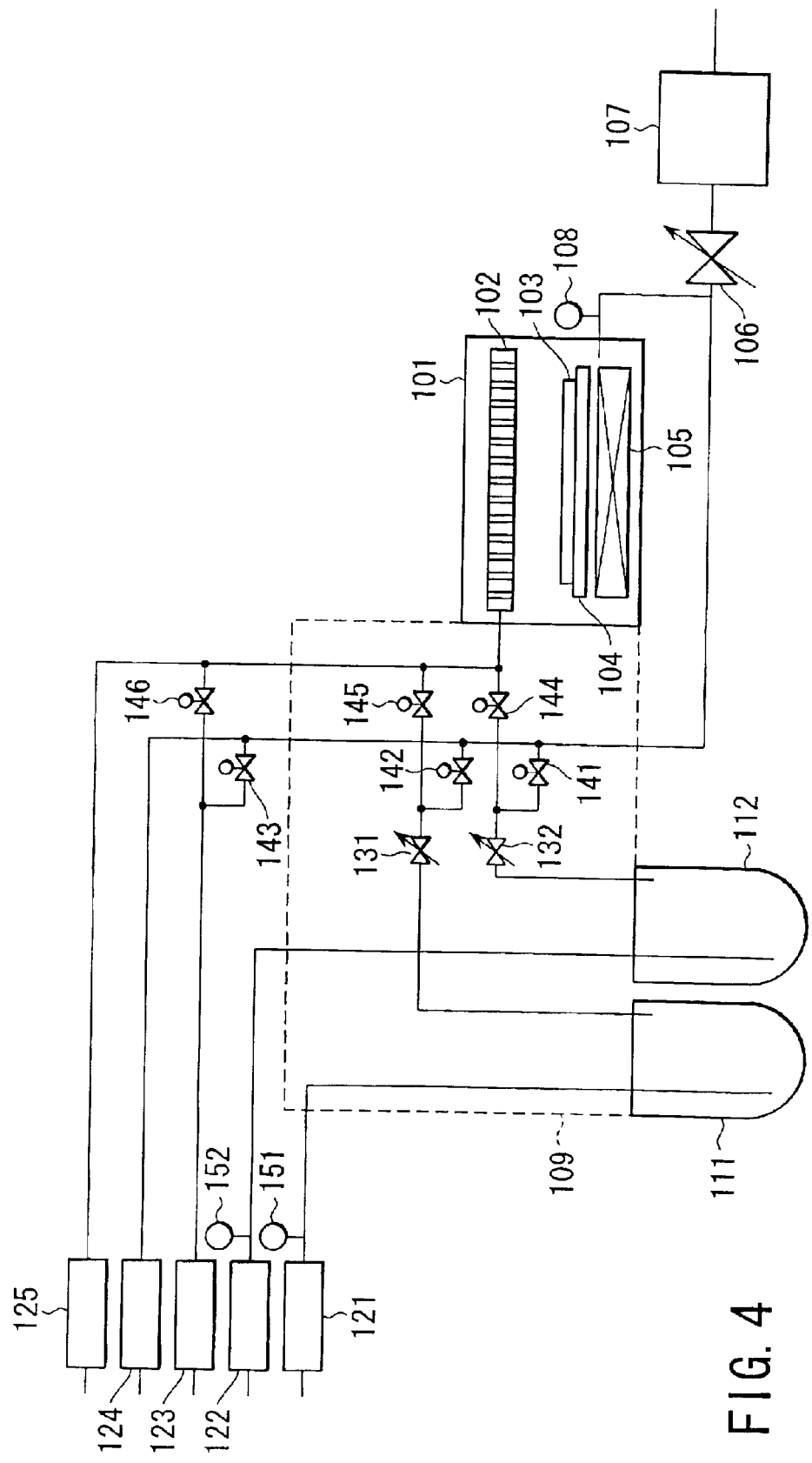
FIG. 4 is a view illustrating a CVD apparatus according to a second embodiment of the invention.

FIG. 4 shows an example of an LPCVD apparatus used in this embodiment. A manufacturing process will be described with reference to FIG. 4.

Firstly, an 8-inch silicon substrate is prepared, and a native oxide film formed on the surface of a silicon substrate is removed by hydrofluoric acid diluted with deionized water. Immediately after the process using diluted hydrofluoric acid, the substrate 103 is conveyed onto a susceptor 104 placed in a reaction chamber 101. After that, the chamber 101 is exhausted by a vacuum pump 107.

After the pressure in the chamber 101 reaches $10^{-2}$ Torr or less, Ar gas is introduced into the chamber 101 at a flow rate of 300 sccm set by mass-flow controllers 124 and 125. In this state, the pressure in the chamber 101 is adjusted to 10 Torr, using a pressure adjustment valve 106 that is connected with a pressure gauge 108. After the pressure in the chamber 101 is stabilized, a heater 105 heats up the substrate 103. The temperature of the substrate 103 is adjusted to 595° C. using a thermocouple located in contact with the susceptor 104 and temperature adjustor (not shown).

After the substrate temperature is stabilized, oxygen gas ($O_2$ gas) is flown into the vacuum pump 107 via a valve 143 at a flow rate adjusted to 200 sccm by a mass flow controller 123, without being passed through the chamber 101. Further, argon gas is flown into source vessels 111 and 112, at a flow rate adjusted to 100 sccm by mass flow controllers 121 and 122, respectively, thereby bubbling respective sources. These source gases are also flown into the vacuum pump 107 via valves 141 and 142 without being passed through the chamber 101.

The source vessels 111 and 112 are filled with TEOS and ZTB, respectively. Temperature control is executed so that the vessels 111 and 112 are adjusted to 70° C. Pressure gauges 151 and 152 and pressure adjustment valves 131 and 132 are used to adjust the pressure in the source vessels 111 and 112 to 100 Torr, respectively. Under these conditions, it is estimated that the flow rates of TEOS and ZTB are 56 sccm and 1.6 sccm, respectively.

Since the temperature of the sources is 70° C., which is higher than room temperature, the pipes and valves used to transport the source gases to the chamber 101 are heated to about 200° C. in an oven, thereby preventing condensation of the source gases. A shower head 102 is also heated to about 200° C. by means of oil to prevent condensation of the source gases in the shower head. The processes described so far are pre-film-forming processes.

The pre-flown oxygen gas and source gasses are introduced into the chamber 101 via the shower head 102 by simultaneously switching the valves 141, 142 and 143 to the valves 144, 145 and 146, thereby starting the film-forming process. The time required for the film-forming process is ten minutes.

Ten minutes later, the supply of TEOS, ZTB and oxygen gasses into the chamber 101 is stopped by switching the valves 144, 145 and 146 to the valves 141, 142 and 143. Immediately after stopping the gas supply, the supply of power to the heater 105 is stopped to cool the substrate 103. After the substrate temperature drops to 200° C., the substrate 103 is taken out of the chamber 101.

The thickness of the thus-formed thin film of Zr silicate was measured by an ellipsometer and found to be 237 nm. Similar film forming is executed with the substrate temperature set to 550° C. and 570° C. The other conditions were identical to the above. The thickness of the Zr silicate film obtained in the case of 550° C. was 191 nm, while that of the Zr silicate film obtained in the case of 570° C. was 176 nm. FIG. 5 illustrates film-forming rates corresponding to these data items.

For comparison, film forming was executed only using TEOS (without ZTB) and in the same procedure as the above. The substrate temperature was set to 570° C. and 590° C. The thickness of the film obtained in the case of 570° C. was 0.7 nm, while that of the film obtained in the case of 590° C. was 0.9 nm. FIG. 6 illustrates film-forming rates corresponding to these data items.

Furthermore, film forming was executed only using ZTB, with the substrate temperature set to 595° C. The resultant film-forming rate was 0.1 nm/min. or less.

From these results, it is understood that a film-forming rate increases only when TEOS and ZTB are simultaneously supplied.

As described above, when only a small amount of ZTB, supplied at about 1/10 or less the flow rate of TEOS, is supplied together with TEOS, a film-forming rate 100 times or more than that obtained when only TEOS has been supplied is realized. This means that a metal silicate film can be formed at a practical film-forming rate.

Moreover, a metal silicate film can be formed by thermal CVD at a relatively low temperature of 600° C. or less, without using activated oxygen such as $O_2$ plasma or ozone that may adversely affect the underlayer substrate. This is because ZTB accelerates the decomposition of TEOS.

The ratio of Zr atoms to the sum of the Zr and Si atoms, contained in the Zr silicate film, i.e., the composition ratio (Zr/(Zr+Si)), was measured using fluorescent X-rays (XRF). As a result, the Zr/(Zr+Si) ratio of a sample obtained by simultaneously supplying TEOS and ZTB was 12–30%. Further, it was confirmed that the Zr/(Zr+Si) ratio of the sample can be controlled within the range of 5–30% by controlling the flow rates of TEOS and ZTB.

The higher the Zr/(Zr+Si) ratio, the higher the relative dielectric constant of the resultant Zr silicate film. In other words, the relative dielectric constant of the resultant Zr silicate film can be controlled by controlling the ratio of Zr to Si. This is very important when it is used for a semiconductor device. Specifically, in the case of an interlayer insulating film or a spacer film, whose relative dielectric constant should be preferably low, the flow rates of ZTB and TEOS are adjusted so that the Zr/(Zr+Si) ratio is low. On the other hand, in the case of a gate dielectrics whose relative dielectric constant should preferably be high, the flow rates of ZTB and TEOS are adjusted so that the Zr/(Zr+Si) ratio is high.

(Embodiment 2-B)

In this embodiment, a metal silicate film is deposited by thermal CVD, using TEOS and hafnium-tertiarybuthoxide (Hf(Ot-$C_4H_9$)$_4$: HTB). This embodiment also uses the LPCVD apparatus shown in FIG. 4, in the above-described embodiment 2-A.

Firstly, an 8-inch silicon substrate is prepared, and a native oxide film formed on the surface of a silicon substrate is removed by hydrofluoric acid diluted with deionized water. Immediately after the process using diluted hydrofluoric acid, the substrate 103 is conveyed onto a susceptor 104 placed in a reaction chamber 101. After that, the chamber 101 is exhausted by a vacuum pump 107.

After the pressure in the chamber 101 reaches $10^{-2}$ Torr or less, Ar gas is introduced into the chamber 101 at a flow rate set to 300 sccm by mass-flow controllers 124 and 125. In this state, the pressure in the chamber 101 is adjusted to 1 Torr, using a pressure adjustment valve 106 connected with a pressure gauge 108. After the pressure in the chamber 101 is stabilized, a heater 105 heats up the substrate 103. The temperature of the substrate 103 is adjusted to 570° C. using a thermocouple located in contact with the susceptor 104 and temperature adjustor (not shown).

After the substrate temperature is stabilized, oxygen gas ($O_2$ gas) is flown into the vacuum pump 107 via a valve 143 at a flow rate adjusted to 200 sccm by a mass flow controller 123, without being passed through the chamber 101. Further, argon gas is flown into source vessels 111 and 112 at a flow rate adjusted to 100 sccm by mass flow controllers 121 and 122, respectively, thereby bubbling respective sources. These source gases are also flown into the vacuum pump 107 via valves 141 and 142 without being passed through the chamber 101.

The source vessels 111 and 112 are filled with TEOS and HTB, respectively. Temperature control is executed so that the vessels 111 and 112 are adjusted to 40° C. and 45° C., respectively. Pressure gauges 151 and 152 and pressure adjustment valves 131 and 132 are used to adjust the pressure in the source vessels 111 and 112 to 100 Torr, respectively. Under these conditions, it is estimated that the flow rates of TEOS and HTB are 12 sccm and 0.31 sccm, respectively.

Since the temperature of the sources is higher than the room temperature, the pipes and valves used to transport the source gases to the chamber 101 are heated to about 200° C. in an oven, thereby preventing condensation of the source gases. A shower head 102 is also heated to about 200° C. by means of oil to prevent condensation of the sources in the shower head. The processes described so far are pre-film-forming processes.

The oxygen gas and source gasses kept flowing in advance are introduced into the chamber 101 via the shower head 102 by simultaneously switching the valves 141, 142 and 143 to the valves 144, 145 and 146, thereby starting the film-forming process. The time required for the film-forming is ten minutes.

Ten minutes later, the supply of TEOS, HTB and oxygen gasses into the chamber 101 is stopped by switching the valves 144, 145 and 146 to the valves 141, 142 and 143. Immediately after the stop of the gas supply, the supply of power to the heater 105 is stopped to cool the substrate 103. After the substrate temperature reduces to 200° C., the substrate 103 is taken out of the chamber 101.

The thickness of the thus-formed thin film of Hf silicate was measured by an ellipsometer and found to be 40 nm.

For comparison, film forming was executed only using TEOS (without HTB) and in the same procedure as the above. The resultant film thickness was zero, i.e., no metal silicate film was formed.

Furthermore, film forming was executed only using HTB, with the substrate temperature set to 570° C. The resultant film-forming rate was 0.1 nm/min. or less.

It is understood, from these results, that a high film-forming rate increases only when TEOS and HTB are simultaneously supplied.

As described above, when only a small amount of HTB, supplied at about 1/10 or less the flow rate of TEOS, is supplied together with TEOS, a film-forming rate remarkably increases. This means that a metal silicate film can be formed at a practical film-forming rate.

Moreover, a metal silicate film can be formed by thermal CVD at a relatively low temperature of 600° C. or less, without using activated oxygen such as $O_2$ plasma or ozone that may adversely affect the underlayer substrate. This is because HTB accelerates the decomposition of TEOS.

The ratio of Hf atoms to the sum of the Hf and Si atoms, which are contained in the Hf silicate film, i.e., the composition ratio (Hf/(Hf+Si)), was measured using XRF. As a result, the Hf/(Hf+Si) ratio of a sample obtained by simultaneously supplying TEOS and HTB was 23%. Further, it was confirmed that the Hf/(Hf+Si) ratio of the sample can be controlled within the range of 5–30% by controlling the flow rates of TEOS and HTB.

The higher the Hf/(Hf+Si) ratio, the higher the relative dielectric constant of the resultant Hf silicate film. In other words, the relative dielectric constant of the resultant Hf silicate film can be controlled by controlling the ratio between Hf and Si. This is very important when it is used for a semiconductor device. Specifically, in the case of an interlayer insulating film or a spacer film, whose relative dielectric constant should be preferably low, the flow rates of HTB and TEOS are adjusted so that the Hf/(Hf+Si) ratio is low. On the other hand, in the case of a gate dielectrics whose relative dielectric constant should be preferably high, the flow rates of HTB and TEOS are adjusted so that the Hf/(Hf+Si) ratio is high.

FIG. 7 shows film-forming results obtained in this embodiment. The substrate temperature, the pressure in the chamber and the film-forming time were set to 570° C., 1 Torr and 10 min., respectively.

(Embodiment 2-C)

This embodiment is directed to an MOS capacitor having a metal silicate film obtained using the method of the embodiment 2-B.

As shown in FIG. 8, a metal silicate film 22 with a thickness of 4 nm was formed on an n-type silicon substrate 21, using the method of the embodiment 2-B. The film thickness was adjusted by adjusting the film-deposition time. It was confirmed, using XRF, that the Hf/(Hf+Si) ratio of the resultant metal silicate film 22 was 10%. Further, a platinum electrode 23 was formed on the metal silicate film 22 by sputtering executed through a shadow mask.

The interface state density of the resultant MOS capacitor was measured by the capacitance-voltage method (C-V method). As a result, it was found that the minimum interface state density formed in the band gap of silicon was $2 \times 10^{11} cm^{-2} eV^{-1}$.

For comparison, a metal silicate film 22 with a thickness of 4 nm was formed by plasma CVD using TEOS and oxygen. The substrate temperature was set to 400° C., and RF plasma of 13.56 MHz was used. Further, a platinum electrode 23 was formed by sputtering. The interface state density of the resultant MOS capacitor was measured and found to be $1 \times 10^{13} cm^{-2} eV^{-1}$.

As another comparative, a metal silicate film 22 with a thickness of 4 nm was formed by thermal CVD using TEOS-$O_3$, thereby forming a MOS capacitor similar to the above. More specifically, the metal silicate film 22 was formed by a hot-wall type CVD apparatus under the atmospheric pressure at 400° C. The upper electrode 23 was made of platinum. The interface state density of the resultant MOS capacitor was measured and found to be $5 \times 10^{12} cm^{-2} eV^{-1}$.

FIG. 9 illustrates the above-mentioned measurement results.

The reason why the metal silicate film formed by plasma CVD has a high interface state density is that the surface of the silicon substrate is damaged by plasma while the metal silicate film is being formed. Similarly, the reason why the metal silicate film formed by thermal CVD using TEOS-$O_3$ has a high interface state density is that $O_3$ has a high chemical reactivity and hence makes it difficult for the silicon substrate surface to maintain a good condition.

On the other hand, the embodiment does not use an active oxidation species, and hence can provide an oxide-film/silicon interface with few defects, which results in a low interface state density.

As stated above, in the embodiment, the decomposition of source gases is accelerated because of the interaction between silicon source and metal source. As a result, a good-quality metal silicate film can be formed by thermal CVD without an oxygen active species even at a low temperature of, for example, 600° C. or less. Further, since no oxygen active species are used, the interface between the metal silicate film and semiconductor substrate has excellent characteristics.

Al or La may be used as the metallic element in place of the above-mentioned Zr or Hf. These elements can increase the effective dielectric constant of the metal silicate film. Accordingly, a thick metal silicate film can be used as the gate dielectrics, which enables a highly reliable and high-performable semiconductor device to be realized. Although in the embodiment, only one metallic element is contained in the metal silicate film, the same advantages can be obtained if two or more elements, which are selected from Zr, Hf, Al and La, are contained therein.

Further, an organic compound containing silicon can be used as the silicon source, and an organic compound containing at least one metallic element selected from Zr, Hf, Al and La can be used as the metal source.

In particular, it is preferable to use an alkoxide compound of silicon, such as TEOS, as the organic compound containing silicon. It is preferable to use, as the organic compound containing a metallic element, an alkoxide compound of a metallic element such as a tertiarybuthoxy compound ($M(Ot-C_4H_9)_4$: M represents Zr, Hf, Al or La). Since these compounds each have a high vapor pressure, the controllability of CVD can be enhanced, with the result that a metal silicate film of a uniform thickness and a controlled composition can be formed.

Furthermore, if the flow rate (supply amount) of the metal source supplied into the chamber is higher than 1/10 that of the silicon source, it is difficult to increase the forming rate of the metal silicate film. On the other hand, if the flow rate of the metal source is not more than 1/10 that of the silicon source, the film-forming rate can be increased considerably.

It is preferable that the following formula is satisfied:

$$0 < N_M / (N_M + N_{Si}) < 0.5$$

where $N_M$ and $N_{Si}$ represent the number of atoms of the metallic element and silicon contained in the metal silicate film, respectively. If the ratio is too high, the metal silicate film is thermally unstable, and in particular, if the ratio is 0.5 or more, this tendency is conspicuous.

(Third Embodiment)

Referring now to FIG. 10, a third embodiment of the invention will be described. This embodiment is directed to a method for controlling the density distribution of a metallic element (Zr, Hf, Al or La) contained in the metal silicate film.

FIG. 10 is a view illustrating gas supply sequences employed in a third embodiment when a metal silicate film is formed using, for example, the CVD apparatus employed in the second embodiment. In this embodiment, TEOS and ZTB (or HTB) are used as the silicon source and metal source, respectively. Since the basic conditions such as film-forming condition employed in this embodiment are similar to those of the second embodiment, no description is given thereof.

Firstly, the supply of TEOS into the reaction chamber provide with a silicon substrate therein is started. After the supply of TEOS is stabilized, the supply of ZTB is started. The supply amount of ZTB is gradually increased and then adjusted to a constant value. After a predetermined time period elapses, the supply amount of ZTB is gradually decreased and then stopped. Thereafter, the supply of TEOS is also stopped. As a result, a metal silicate film is formed on the silicon substrate. After that, the surface of the metal silicate film is nitrided using nitrogen plasma.

The thus-obtained metal silicate film has, for example, the density distributions of the metallic element and nitrogen as shown in FIG. 2 referred to in the first embodiment. Accordingly, a semiconductor device with the same advantages as stated in the first embodiment can be obtained through the process steps as shown in FIGS. 3A–3E.

Further, the third embodiment can employ the silicon and metal sources, other than TEOS and ZTB, as described in detail in the second embodiment. Therefore, if the third embodiment uses, as in the second embodiment, thermal CVD that does not use an active oxygen species, it can provide a semiconductor device having advantages similar to those stated in the second embodiment.

As described above, in the third embodiment, the density distributions of a metallic element and nitrogen, contained in a metal silicate film, can be optimized. Accordingly, the embodiment can provide a highly reliable and high-performance semiconductor device. In addition, when the embodiment employs thermal CVD that does not use an active oxygen species, it can provide a further highly reliable and high-performance semiconductor device.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device, comprising: supplying, into a chamber in which a substrate is held, an organic compound containing silicon and an organic compound containing a metallic element selected from a group consisting of Zr, Hf, Al and La; and
   forming a silicon oxide film containing the metallic element on the substrate by a thermal CVD method that does not use an active oxygen species.

2. The method according to claim 1, further comprising supplying an $O_2$ gas into the chamber.

3. The method according to claim 1, wherein the silicon oxide film containing the metallic element is a gate dielectric of a metal-oxide-semiconductor field effect transistor.

4. The method according to claim 1, wherein the organic compound containing the metallic element further contains another metallic element selected from a group consisting of Zr, Hf, Al and La.

5. The method according to claim 1, wherein an amount of the organic compound containing the metallic element and supplied to the chamber is not more than 1/10 an amount of the organic compound containing silicon and supplied to the chamber.

6. The method according to claim 1, wherein the following formula is satisfied:

$$0 < N_M/(N_M + N_{Si}) < 0.5$$

where the $N_M$ represents the number of atoms of the metallic element contained in the silicon oxide film, and the $N_{Si}$ represents the number of atoms of silicon contained in the silicon oxide film.

7. The method according to claim 1, wherein the organic compound containing silicon is an alkoxide compound of silicon.

8. The method according to claim 7, wherein the alkoxide compound of silicon is tetraethoxysilane.

9. The method according to claim 1, wherein the organic compound containing the metallic element is an alkoxide compound of the metallic element.

10. The method according to claim 9, wherein the alkoxide compound of the metallic element is a tertiarybuthoxy compound.

* * * * *